United States Patent [19]
Hasegawa

[11] Patent Number: 5,461,604
[45] Date of Patent: Oct. 24, 1995

[54] PCM DIGITAL AUDIO SIGNAL PLAYBACK APPARATUS

[75] Inventor: Tsunao Hasegawa, Tokorozawa, Japan

[73] Assignee: Pioneer Electronic Corporation, Tokyo, Japan

[21] Appl. No.: 291,504

[22] Filed: Aug. 17, 1994

Related U.S. Application Data

[63] Continuation of Ser. No. 141,717, Oct. 27, 1993, abandoned, which is a continuation of Ser. No. 780,972, Oct. 23, 1991, abandoned.

[30] Foreign Application Priority Data

Jan. 31, 1991 [JP] Japan ................................. 3-011088

[51] Int. Cl.$^6$ ................................................. G11B 20/10
[52] U.S. Cl. ................................. 369/124; 364/724.1
[58] Field of Search .......................... 364/724.1, 724.16; 369/124; 381/31

[56] References Cited

U.S. PATENT DOCUMENTS 5,075,880  12/1991  Moses et al. .................... 364/724.1

OTHER PUBLICATIONS

M. Schlichte, "Zur Spline-Interpolation be: Digital Filters", Frequenz, vol. 38, No. 2, Feb. 1984, pp. 44–49.
"Spline Function and Its Applications" by K. Ichida and F. Yoshimoto, Kyoiku Publishing.
J. B. H. Peek, "Communications Aspect of the Compact Disc Digital Audio Systems." IEEE, vol. 23, No. 2, Feb. 1985, pp. 7–15.
R. Finck et al., "Third-generation decoding ICs for CD players," Electronic Components & Applications, vol. 8, No. 3, 1988 pp. 145–152.
D. Goedhart et al., "Low-pass Filter and Output Circuits for Compact Disc," Proceedings of ICCE, vol. III, No. 3.3, 5 Jun. 1985, pp. 46–47.
H. S. Hou et al., "Cubic Splines for Image Interpolation and Digital Filtering", IEEE Transactions on Acoustics, Speech, and Signal Processing, vol. 26, No. 6, Dec. 1978, pp. 508–517.

*Primary Examiner*—Aristotelis Psitos
*Assistant Examiner*—Duncan Wilkinson
*Attorney, Agent, or Firm*—Keck, Mahin & Cate

[57] ABSTRACT

A PCM digital audio signal playback apparatus is provided for multiplying a PCM digital audio signal to n times the sampling rate, interpolating extra sampling points with zero signals, and spline-function interpolating with an FIR digital filter. Accordingly, a sound reproduced from the output audio signal of the apparatus will be more natural as compared with common high-cut filtering with a high-cut filter.

1 Claim, 5 Drawing Sheets

FIG. 4

| | COEFFICIENTS | | COEFFICIENTS | | COEFFICIENTS |
|---|---|---|---|---|---|
| $\psi_0$ | $-3.09475 \times 10^{-6}$ | $\psi_{21}$ | $0.0190296$ | $\psi_{42}$ | $-1.84809 \times 10^{-9}$ |
| $\psi_1$ | $-3.12794 \times 10^{-6}$ | $\psi_{22}$ | $7.45058 \times 10^{-9}$ | $\psi_{43}$ | $-3.26497 \times 10^{-3}$ |
| $\psi_2$ | $-1.32743 \times 10^{-7}$ | $\psi_{23}$ | $-0.0398449$ | $\psi_{44}$ | $-0.0029586$ |
| $\psi_3$ | $5.89083 \times 10^{-6}$ | $\psi_{24}$ | $-0.100505$ | $\psi_{45}$ | $-1.17293 \times 10^{-3}$ |
| $\psi_4$ | $1.49428 \times 10^{-5}$ | $\psi_{25}$ | $-0.110913$ | $\psi_{46}$ | $5.82077 \times 10^{-11}$ |
| $\psi_5$ | $1.64902 \times 10^{-5}$ | $\psi_{26}$ | $-2.98023 \times 10^{-8}$ | $\psi_{47}$ | $5.6018 \times 10^{-4}$ |
| $\psi_6$ | $7.27596 \times 10^{-12}$ | $\psi_{27}$ | $0.232233$ | $\psi_{48}$ | $5.07615 \times 10^{-4}$ |
| $\psi_7$ | $-3.45277 \times 10^{-5}$ | $\psi_{28}$ | $0.585786$ | $\psi_{49}$ | $2.01242 \times 10^{-4}$ |
| $\psi_8$ | $-8.70929 \times 10^{-5}$ | $\psi_{29}$ | $0.896447$ | $\psi_{50}$ | $-6.32099 \times 10^{-11}$ |
| $\psi_9$ | $-9.61117 \times 10^{-5}$ | $\psi_{30}$ | $1$ | $\psi_{51}$ | $-9.61117 \times 10^{-5}$ |
| $\psi_{10}$ | $-5.82077 \times 10^{-11}$ | $\psi_{31}$ | $0.896447$ | $\psi_{52}$ | $-8.70929 \times 10^{-5}$ |
| $\psi_{11}$ | $2.01242 \times 10^{-4}$ | $\psi_{32}$ | $0.585786$ | $\psi_{53}$ | $-3.45277 \times 10^{-5}$ |
| $\psi_{12}$ | $5.07615 \times 10^{-4}$ | $\psi_{33}$ | $0.232233$ | $\psi_{54}$ | $8.07177 \times 10^{-12}$ |
| $\psi_{13}$ | $5.6018 \times 10^{-4}$ | $\psi_{34}$ | $-3.58559 \times 10^{-8}$ | $\psi_{55}$ | $1.64902 \times 10^{-5}$ |
| $\psi_{14}$ | $5.82077 \times 10^{-11}$ | $\psi_{35}$ | $-0.110913$ | $\psi_{56}$ | $1.49428 \times 10^{-5}$ |
| $\psi_{15}$ | $-1.17293 \times 10^{-3}$ | $\psi_{36}$ | $-0.100505$ | $\psi_{57}$ | $5.89083 \times 10^{-6}$ |
| $\psi_{16}$ | $-0.0029586$ | $\psi_{37}$ | $-0.0398449$ | $\psi_{58}$ | $-1.32743 \times 10^{-7}$ |
| $\psi_{17}$ | $-3.26497 \times 10^{-3}$ | $\psi_{38}$ | $7.15954 \times 10^{-9}$ | $\psi_{59}$ | $-3.12794 \times 10^{-6}$ |
| $\psi_{18}$ | $-1.86265 \times 10^{-9}$ | $\psi_{39}$ | $0.0190296$ | $\psi_{60}$ | $-3.09475 \times 10^{-6}$ |
| $\psi_{19}$ | $0.0068363$ | $\psi_{40}$ | $0.0172439$ | | |
| $\psi_{20}$ | $0.172439$ | $\psi_{41}$ | $0.0068363$ | | |

PCM DIGITAL AUDIO SIGNAL PLAYBACK APPARATUS

This is a continuation application of Ser. No. 08/141,717, filed Oct. 27, 1993, which is a continuation application of Ser. No. 07/780,972, filed Oct. 23, 1991 both cases are now abandoned.

BACKGROUND OF INVENTION

1. Field of the Invention

The present invention relates to a PCM digital audio signal playback apparatus for reproducing PCM (pulse code modulation) digital audio signals recorded in a recording medium, e.g. a compact disk.

2. Description of the Related Art

The recording frequencies of a digital audio signal to be recorded onto a recording medium, e.g. a compact disk (CD) or a digital audio tape (DAT), are limited by the sampling theorem to stay lower than a half the sampling frequency for avoiding any folding distortion.

In common, human ears can perceive up to 20·KHz of a single tone (pure sound) and thus, the sampling frequency is 44.1 KHz for CD recording and 48 KHz for DAT recording.

It is now acknowledged through various problems that elimination of a high-frequency component from an audio signal with a filter having a filtering characteristic of acutely blocking frequencies higher than 20 KHz, causes unfavorable results in a reproduced sound and also, such ringing effects as developed in the waveform response to a signal having high-frequency components signal such as an impulse will deteriorate the reproductivity of waveforms.

SUMMARY OF THE INVENTION

It is thus an object of the present invention to provide a PCM digital audio signal playback apparatus capable of reproducing natural sounds which are hardly obtained through elimination of a high-frequency component with a common high-cut filter and providing a better waveform response to a high-frequency carrying signal, e.g. an impulse, without causing unwanted ringing effects.

A PCM digital audio signal playback apparatus for reproduction of a PCM digital audio signal read out from a recording medium, according to the present invention, comprises a first zero interpolating means for multiplying the PCM digital audio signal to n times the sampling rate (n is an integer not less than two) and interpolating extra sampling points with zero signals, and an FIR (finite impulse response) digital filter arranged for receiving an output signal of the first zero interpolating means and having a series of values representing the impulse response in an m-order spline function (m is an integer not less than two) as multiplication coefficients.

Accordingly, the PCM digital audio signal playback apparatus allows a PCM digital audio signal to be multiplied to n times the sampling rate and after interpolating extra sampling points with zero signals, spline-function interpolated with the FIR digital filter. As the result, a more natural sound can be reproduced from the output audio signal of the apparatus as compared with common high-cut filtering with a conventional high-cut filter.

BRIEF DESCRIPTION OF THE DRAWINGS

FIG. 4 is a list showing a series of coefficients of the FIR digital filter;

DETAILED DESCRIPTION OF THE PREFERRED EMBODIMENTS

Preferred embodiments of the present invention will be described referring to the accompanying drawings.

Figure 1:
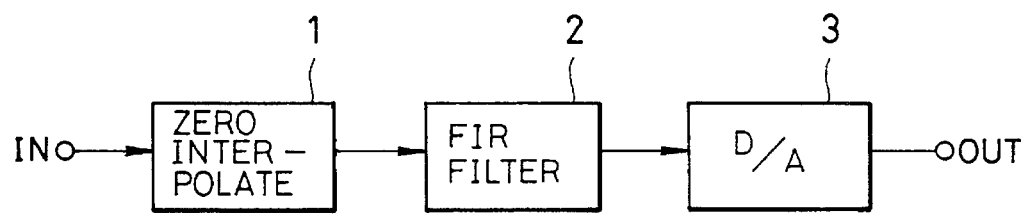
FIG. 1 is a block diagram of a playback apparatus showing one preferred embodiment of the present invention.
Figure 2:
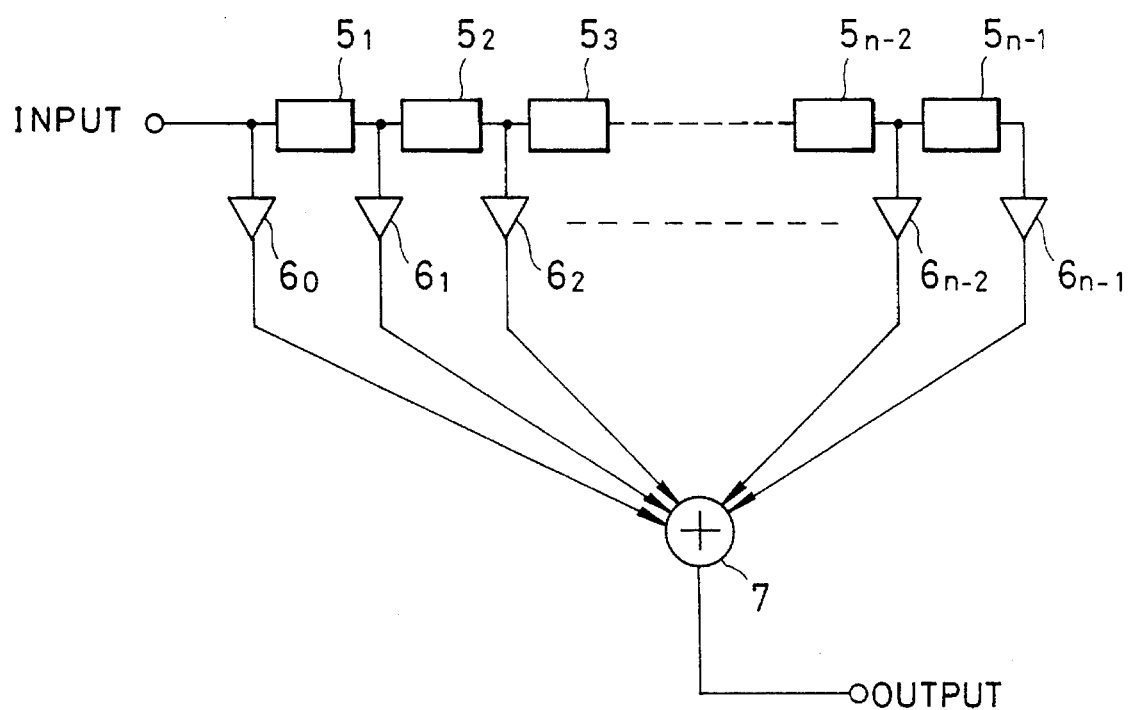
FIG. 2 is a block diagram of an FIR digital filter of the apparatus shown in FIG. 1.

FIG. 1 illustrates a PCM digital audio signal playback apparatus in which a PCM digital audio signal read out from a recording medium is supplied to an input terminal IN. In compact disk recording, a digital audio signal is read out from a compact disk with a pickup (not shown), EFM (eight to fourteen modulation) demodulated, and error corrected prior to delivery to the terminal IN. The input terminal IN is coupled to a zero interpolation circuit 1 where the input digital signal is multiplied to four times the sampling frequency fs and the interpolation is made for transmission of data directly at the original 44.1 KHz sampling points while assigning zero signals to extra sampling points other than the original sampling points. The output terminal of the zero interpolation circuit 1 is coupled to an FIR digital filter 2. The FIR digital filter 1 comprises a series of delayers $5_1$ to $5_{n-1}$, coefficient multipliers $6_0$ to $6_{n-1}$, and an adder 7, as shown in FIG. 2. The delayers $5_1$ to $5_{n-1}$ are coupled one another in series and each of them is sandwiched between the inputs of the two adjacent multipliers $6_0$ and $6_1$, . . . or $6_{n-2}$ and $6_{n-1}$. The adder 7 is arranged for summing output signals of the multipliers $6_0$ to $6_{n-1}$ and coupled to the output of the filter 2. The coefficient multipliers $6_0$ to $6_{n-1}$ of the filter 2 have coefficients $\phi$ to $\phi_{n-1}$ respectively which represent the impulse response of the spline function. The output terminal of the FIR digital filter 2 is coupled to a D/A converter 3 where the digital audio signal from the filter 2 is converted into an analog form at a frequency of 4fs which is equal to 4 times the sampling frequency fs. The analog audio signal from the D/A converter 3 is then transferred to an output terminal OUT.

The impulse response of the spline function in the FIR digital filter 2 will now be explained. Assuming that the spline function is associated with a row of sampling points spaced at equal intervals $\lambda_L$, the spline function S(t) is expressed, using a B spline $_{[b]}\phi_L(t)$, as:

$$S(t) = \sum_{L=-\infty}^{\infty} \lambda_{L[b]}\phi_L(t) \quad (1)$$

When h is a sampling interval and $\xi_L$ is a node sequence, the B spline of second order is obtained from:

$$_{[b]}\phi_L(t) = 3h^{-2} \sum_{P=0}^{3} (-1)^P (t - \xi_{L+P})_+^2 / P!(3-P)! \quad (2)$$

where, $$(t - \xi_{L+P})_+^2 = \begin{cases} (t - \xi_{L+P})^2 & ; t > \xi_{L+P} \\ 0 & ; t \leq \xi_{L+P} \end{cases}$$

$$\xi_{L+P} = \left(L - \frac{3}{2}\right)h$$

$$(L = 0, \pm 1, \pm 2 \ldots)$$

When the discrete value is $S(t_K)$ and the impulse response is $_{[S]}\phi(t)$, the convolution of the second-order spline function is expressed by:

$$S(t) = \sum_{h=-\infty}^{\infty} S(t_k) \times {}_{[S]}\phi(t - t_k) \qquad (3)$$

The impulse response $_{[S]}\phi(t)$ of the second-order spline function is now calculated from:

$$_{[S]}\phi(t) = \sqrt{2} \sum_{L=-\infty}^{\infty} (-3 + 2\sqrt{2})^{|L|} {}_{[b]}\phi_L(t) \qquad (4)$$

Figure 3:
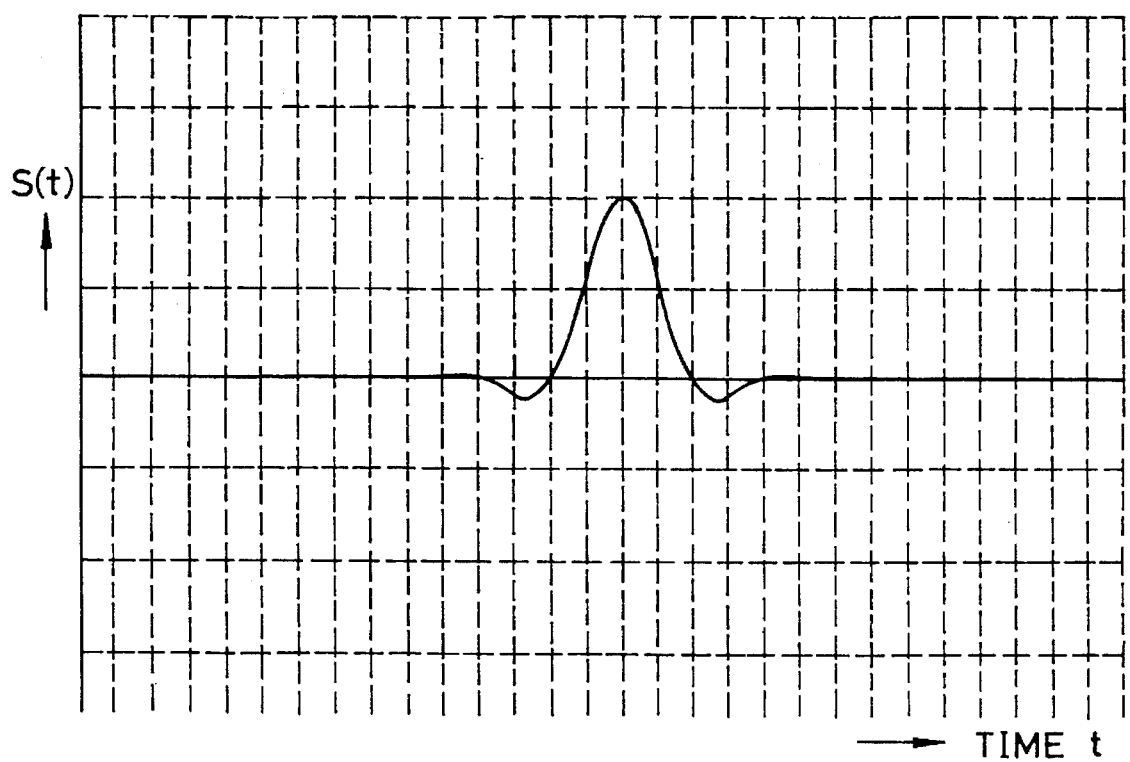
FIG. 3 is a waveform diagram showing the impulse response of a spline function.

As understood, the impulse response $_{[S]}\phi(t)$ is given by substituting the equation (2) for the equation (4) and its waveform is illustrated in FIG. 3. Oversampling in the FIR digital filter is performed through sampling input data at the sampling points of the impulse response, or more specifically at a higher sampling rate than the original rate h. The FIR digital filter has the coefficients corresponding to the impulse response and thus, can conduct an operation equal to an interpolation using the spline function.

More details of the spline function are depicted in e.g. "Spline function and its applications" by K. Ichida and F. Yoshimoto, Kyoiku Publishing.

The FIR digital filter 2 shown in FIG. 2 is arranged for carrying out oversampling actions at a sampling rate of 4 times the frequency rate fs and contains the coefficients as shown in FIG. 4. Although the equation (4) represents a chain of infinite pulses, they may be cut to short when an error is negligible. FIG. 4 shows that the equation is calculated up to n=61 thus allowing the FIR digital filter to conduct a 61-step filtering action. It is understood that n is not limited to 61.

Figure 5:
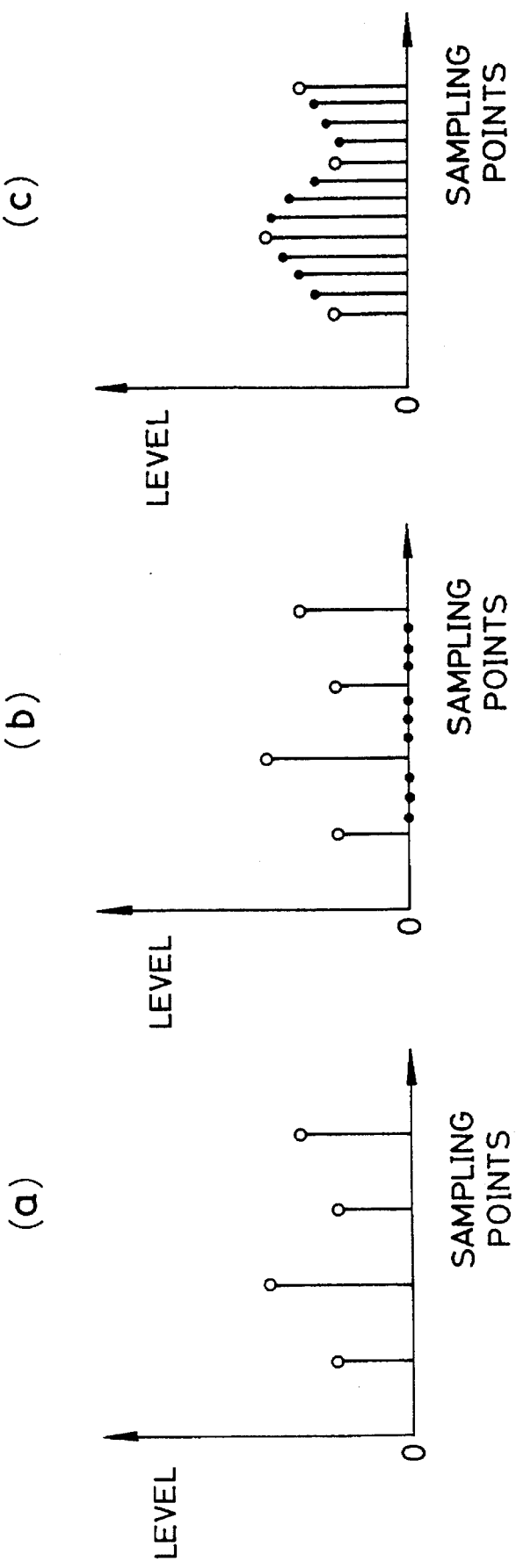
FIG. 5 is a diagram showing a zero interpolation action and an interpolation action with a spline function in the playback apparatus.

In the PCM digital audio signal playback apparatus of the present invention, a PCM digital audio signal of the sampling frequency fs read out from a recording medium is oversampled at intervals of ¼ by the zero interpolation circuit 1 in which the resultant extra sampling points are interpolated with zero signals. More particularly, the PCM digital audio signal of the sampling frequency fs which has a sampled form shown in FIG. 5-a, is processed by the zero interpolation circuit 1 where the data at the original sampling points are transmitted directly, and zero signals are assigned to three extra sampling points (the black dots shown in FIG. 5-b) which are arranged at equal intervals of ¼fs in each period 1/fs, as shown in FIG. 5-b. The interpolated PCM digital audio signal from the zero interpolation circuit 1 is then oversampled to a form shown in FIG. 5-c by the FIR digital filter 2 using a spline function interpolation technique. The spline function interpolated PCM digital audio signal from the FIR digital filter 2 is transferred to the D/A converter 3 where it is converted to its analog form before transmission from the output terminal OUT.

The spline function produces a sequence of differential coefficients assigned to the sampling points and if its order number is low, the convergence in a signal is enhanced, as illustrated in the form, of an impulse response in FIG. 3, thus generating less ringing effects. The signal interpolated using the spline function contains a high-frequency component higher than fs/2 so that it can produce a natural reproduction sound which is hardly developed with a conventional acute high-cut filter device.

Figure 6:
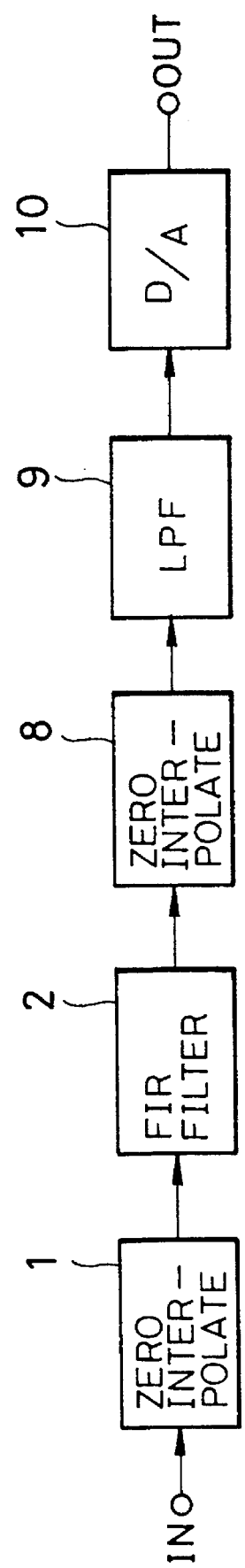
FIG. 6 is a block diagram showing another embodiment of the present invention.

FIG. 6 shows another embodiment of the present invention, in which an extra zero interpolation circuit 8 is coupled to the output of the FIR digital filter 2 of the PCM digital audio signal playback apparatus shown in FIG. 1. An output signal from the zero interpolation circuit 8 is fed through a lowpass filter (LPF) 9 to a D/A converter 10. The zero interpolation circuit 8 is arranged for multiplying the spline function interpolated PCM digital audio signal of the sampling frequency 4fs by two times to 8fs of the sampling frequency and interpolating the extra sampling points with zero's. The LPF 9 is a low order (e.g. third order) digital lowpass filter having a frequency response which is flat under the frequency fs and gradually falls off for elimination of a high-degree harmonic component. Hence, the sampling rates can be increased higher than that of the apparatus shown in FIG. 1 and the interpolation using a high-order spline function will be conducted at a less number of calculating actions and a lower speed of arithmetic operation.

Although the zero interpolation circuit 1 performs multiplications by 4 times of the sampling frequency fs and the zero interpolation circuit 8 performs multiplications by 2 times of the sampling frequency 4fs according to the embodiments, the present invention is not limited to those multiplications. The number of the sampling points is at least doubled.

Although the D/A converter is installed in the PCM digital audio signal playback apparatus of each embodiment, it may separately be arranged outside the playback apparatus.

As set forth above, the PCM digital audio signal playback apparatus allows a PCM digital audio signal to be multiplied to n times the sampling rate and after interpolating extra sampling points with zero signals, spline-function interpolated with the FIR digital filter. Accordingly, more natural reproduction sounds can be obtained as compared with common high-cut filtering with a conventional high-cut filter. Also, a high-frequency carrying signal such as an impulse can be processed without causing ringing effects in the waveform response.

What is claimed is:

1. A Pulse Code Modulation (PCM) digital audio signal playback apparatus for reproduction of a PCM digital audio signal read out from a recording medium, comprising:

first zero interpolating means for multiplying said PCM digital signal to n times the sampling rate (n is an integer not less than two) and interpolating extra sampling points with zero signals;

a finite impulse response (FIR) digital filter arranged for receiving an output signal of said first zero interpolating means and having a series of values representing the impulse response in an m-order spline function (m is an integer not less than two) as multiplication coefficients;

second zero interpolating means for multiplying the output signal of said FIR digital filter to g times the sampling rate (g is an integer not less than two) and interpolating extra sampling points with zero signals; and a relatively low-order lowpass filter coupled to the output of said second zero interpolating means.

\* \* \* \* \*